(12) United States Patent
Huang et al.

(10) Patent No.: US 7,565,220 B2
(45) Date of Patent: Jul. 21, 2009

(54) TARGETED DATA COLLECTION ARCHITECTURE

(75) Inventors: Chung-Ho Huang, San Jose, CA (US); Shih-Jeun Fan, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 184 days.

(21) Appl. No.: 11/536,585

(22) Filed: Sep. 28, 2006

(65) Prior Publication Data

US 2008/0082653 A1    Apr. 3, 2008

(51) Int. Cl.
*G06F 19/00* (2006.01)
(52) U.S. Cl. ...................................... 700/121
(58) Field of Classification Search .................. 700/32, 700/51, 121; 707/102
See application file for complete search history.

(56) References Cited

U.S. PATENT DOCUMENTS

| | | |
|---|---|---|
| 4,267,572 A | 5/1981 | Witte |
| 4,365,303 A | 12/1982 | Hannah et al. |
| 4,490,806 A | 12/1984 | Enke et al. |
| 4,645,348 A | 2/1987 | Dewar et al. |
| 4,734,909 A | 3/1988 | Bennett et al. |
| 5,051,606 A | 9/1991 | Ikehara |
| 5,113,344 A | 5/1992 | Kellogg et al. |
| 5,119,498 A | 6/1992 | McNeill et al. |
| 5,301,122 A | 4/1994 | Halpern |
| 5,347,460 A | 9/1994 | Gifford et al. |
| 5,386,567 A | 1/1995 | Lien et al. |
| 5,403,621 A | 4/1995 | Jackson et al. |
| 5,450,205 A | 9/1995 | Sawin et al. |
| 5,546,322 A | 8/1996 | Gifford et al. |

(Continued)

FOREIGN PATENT DOCUMENTS

AU    9197198    3/1999

(Continued)

OTHER PUBLICATIONS

Rutkowski et al.; "Smart SnesorMesh:Intelligent Sensor Clusters Configuration and Location Discovery for Collaborative Information Processing", 2005; Academic Center for Computing and Media Studies; pp. 147-157.*

(Continued)

*Primary Examiner*—Albert DeCady
*Assistant Examiner*—Chad Rapp
(74) *Attorney, Agent, or Firm*—IP Strategy Group, P.C.

(57) ABSTRACT

A targeted data collection system configured to collect processing data in a plasma processing system is provided. The system includes a data collection host and a plurality of plasma processing components having a plurality of sensors such that each of the plurality of plasma processing components having at least one sensor. Each of the sensors implements at least one intelligent targeted data agent that governs sensor data collection behavior. The system further includes a communication network coupling data collection host and plurality of sensors for bi-directional communication such that a given sensor of plurality of sensors receive information from data collection host pertaining to plasma processing system conditions occurring elsewhere from given sensor. Information received from data collection host causes the given sensor to collect at least a portion of the processing data in a first manner different from a second manner employed by sensor prior to receiving e information from the data collection host.

28 Claims, 6 Drawing Sheets

U.S. PATENT DOCUMENTS

| | | | |
|---|---|---|---|
| 5,553,220 A | 9/1996 | Keene |
| 5,579,511 A | 11/1996 | Cavasa et al. |
| 5,664,066 A | 9/1997 | Sun et al. |
| 5,715,051 A | 2/1998 | Luster |
| 5,717,737 A | 2/1998 | Doviak et al. |
| 5,757,483 A | 5/1998 | Pierce, III |
| 5,831,851 A | 11/1998 | Eastburn et al. |
| 5,937,365 A | 8/1999 | Friton et al. |
| 5,977,913 A | 11/1999 | Christ |
| 6,077,386 A | 6/2000 | Smith, Jr. et al. |
| 6,090,302 A | 7/2000 | Smith, Jr. et al. |
| 6,091,749 A | 7/2000 | Hoffmaster et al. |
| 6,138,241 A | 10/2000 | Eckel et al. |
| 6,157,867 A | 12/2000 | Hwang et al. |
| 6,204,768 B1 | 3/2001 | Kosugi et al. |
| 6,225,901 B1 | 5/2001 | Kail, IV |
| 6,233,492 B1 | 5/2001 | Nakamura et al. |
| 6,243,738 B1 | 6/2001 | Hayles et al. |
| 6,265,831 B1 | 7/2001 | Howald et al. |
| 6,292,108 B1 | 9/2001 | Straser et al. |
| 6,370,454 B1 | 4/2002 | Moore |
| 6,411,994 B2 | 6/2002 | van Allen et al. |
| 6,425,006 B1 | 7/2002 | Chari et al. |
| 6,446,192 B1 | 9/2002 | Narasimhan et al. |
| 6,493,756 B1 | 12/2002 | O'Brien et al. |
| 6,501,377 B2 | 12/2002 | Ebata et al. |
| 6,510,350 B1 | 1/2003 | Steen, III et al. |
| 6,515,586 B1 | 2/2003 | Wymore |
| 6,526,355 B1 | 2/2003 | Ni et al. |
| 6,535,123 B2 | 3/2003 | Sandelman et al. |
| 6,553,336 B1 | 4/2003 | Johnson et al. |
| 6,640,151 B1 | 10/2003 | Somekh et al. |
| 6,865,522 B1 | 3/2005 | Gastiger et al. |
| 7,016,811 B2 * | 3/2006 | Peck et al. ............ 702/188 |
| 7,113,838 B2 | 9/2006 | Funk et al. |
| 7,123,980 B2 | 10/2006 | Funk et al. |
| 7,146,237 B2 * | 12/2006 | Lev-Ami et al. ........ 700/121 |
| 7,356,580 B1 | 4/2008 | Huang et al. |
| 2005/0159911 A1 | 7/2005 | Funk et al. |
| 2005/0171627 A1 | 8/2005 | Funk et al. |
| 2008/0082579 A1 | 4/2008 | Huang et al. |
| 2008/0243988 A1 | 10/2008 | Huang et al. |

FOREIGN PATENT DOCUMENTS

| | | |
|---|---|---|
| AU | 3663099 | 11/1999 |
| BR | 8801840 | 11/1988 |
| BR | 9300032 A | 7/1993 |
| CA | 2082118 A1 | 7/1993 |
| CN | 1074767 | 7/1993 |
| CN | 1276072 | 6/2000 |
| DE | 3104178 A1 | 11/1981 |
| DE | 3812607 A1 | 10/1988 |
| DE | 4017902 A1 | 12/1990 |
| DE | 295039 A5 | 10/1991 |
| DE | 69330533 T | 9/2001 |
| DE | 69133240 T2 | 1/2004 |
| EP | 0373773 A1 | 6/1990 |
| EP | 0403117 | 12/1990 |
| EP | 0468803 B1 | 1/1992 |
| EP | 0490373 | 6/1992 |
| EP | 0552873 B1 | 7/1993 |
| EP | 0584676 | 3/1994 |
| EP | 0677737 A2 | 10/1995 |
| EP | 1012683 A3 | 6/2000 |
| EP | 1105703 | 6/2001 |
| ES | 2160100 | 11/2001 |
| FR | 2614122 | 10/1988 |
| FR | 2692701 | 12/1993 |
| GB | 2020009 A | 11/1979 |
| GB | 2070235 A | 9/1981 |
| GB | 2202062 | 9/1988 |
| GB | 2203869 | 10/1988 |
| JP | 56150331 A | 11/1981 |
| JP | 63279340 | 11/1988 |
| JP | 2139610 A | 5/1990 |
| JP | 3024608 A | 2/1991 |
| JP | 3030808 A | 5/1991 |
| JP | 1670092 | 6/1992 |
| JP | 4213715 A | 6/1992 |
| JP | 5265927 A | 10/1993 |
| JP | 6224098 | 8/1994 |
| JP | 3179997 A | 10/1995 |
| JP | 8021015 | 1/1996 |
| JP | 8062141 A | 3/1996 |
| JP | 2001512865 | 8/2001 |
| JP | 18-501680 A | 1/2006 |
| KR | 10-2006-0086602 A | 8/2006 |
| WO | WO-8912274 | 12/1989 |
| WO | WO9908168 A2 | 2/1999 |
| WO | WO-9908168 A2 | 2/1999 |
| WO | WO-99/54694 A1 | 10/1999 |

OTHER PUBLICATIONS

"Written Opinion", Issue in PCT Application No. PCT/US2007/079471; Mailing Date: Jan. 9, 2008.

"International Search Report", Issue in PCT Application No. PCT/US2007/079471; Mailing Date: Jan. 9, 2008.

"International Search Report", Issued in PCT Application No. PCT/US2008/058320; Mailing Date: Aug. 29, 2008.

"Written Opinion", Issued in PCT Application No. PCT/US2008/058320; Mailing Date: Aug. 29, 2008.

"Non Final Office Action", U.S. Appl. No. 11/693,664, Mailing Date: Nov. 12, 2008.

"International Search Report", Mailed: Mar. 3, 2002, International Application No. PCT/US01/08667, Filed on Mar. 16, 2001, Applicants: Lam Research Corporation.

"International Search Report", Mailed Apr. 19, 2002, International Application No. PCT/US98/16490, Filed on Mar. 19, 2001, Applicants: Lam Research Corporation.

"International Search Report", Mailed: Mar. 8, 1999, International Application No. PCT/US98/16490, Filed: Aug. 7, 1998, Applicants: DE Schrijver, Stefaan, A.

"Notice of Office Action", mailed Sep. 10, 2003, U.S. Appl. No. 09/539,313, filed Mar. 30, 2000, Inventors: Huang et al.

"Notice of Office Action", mailed: Feb. 24, 2005, U.S. Appl. No. 09/539,313, filed Mar. 30, 2000, Inventors: Huang et al.

"Final Office Action", U.S. Appl. No. 09/539,313, Mailed: Oct. 19, 2005.

"Non Final Office Action", U.S. Appl. No. 09/539,313, Mailed: May 23, 2006.

"Final Office Action", U.S. Appl. No. 09/539,313, Mailed: Nov. 20, 2006.

Lee, et al., "Internet-Based Distributed Measurement and Control Applications", IEEE Instrumentation & Measurement Magazine, Jun. 1999, p. 23-27.

"Non Final Office Action", U.S. Appl. No. 09/539,313, Mailed: Feb. 24, 2005.

"Non Final Office Action", U.S. Appl. No. 09/539,313, Mailed: Aug. 26, 2004.

"Non Final Office Action", U.S. Appl. No. 09/539,313, Mailed Sep. 10, 2003.

"Non Final Office Action", U.S. Appl. No. 09/539,313, Mailed: Apr. 7, 2003.

"IEEE Standard for a Smart Transducer Interface for Sensors and Actuators-Transducer to Microprocessor Communication Protocols and Transducer Electronic Data Sheet (TEDS) Format", IEEE Standards Board, Sep. 16, 1997, The Institute of Electrical and Electronics Engineers, Inc., IEEE Std 1451.2-1997, 1-114.

Lee, et al., "Internet-Based Distributed Measurement and Control Applications", IEEE Instrumentation and Measurement Magazine, vol. 2, No. 2, Jun. 1999, pp. 23-27.

"Control circuit for hot plugging a ROS cartridge", IBM Technical Disclosure Bulletin. vol. 29, No. 3, Aug. 1986, New York US pp. 1060-1062.

"Final Office Action", U.S. Appl. No. 09/539,313, Mailed: Mar. 10, 2004.

* cited by examiner

TARGETED DATA COLLECTION ARCHITECTURE

BACKGROUND OF THE INVENTION

Plasma processing has continued to evolve as manufacturing companies attempt to stay competitive in the semiconductor industry. To gain a competitive edge, manufacturers have to be able to effectively and efficiently troubleshoot problems that may arise. Troubleshooting the problems generally involves analyzing data collected during processing.

In plasma processing, data is being continuously collected by a plurality of sensors. As discussed herein, sensor refers to a device that may be employed to detect conditions and/or signals of a plasma processing component. For ease of discussion, the term "component" will be used to refer to an atomic or a multi-part assembly in a plasma processing system. Thus, a component may be as simple as a gas line or may be as complex as the entire process module.

The type and amount of data that are being collected by the sensors have increased in recent years. However, more data has not, in some cases, translated into more efficient and effective troubleshooting. Instead, the end-users of the process data are usually faced with a huge volume of data that is difficult to read and understand. In addition, the data from various data sources may be stored in different locations, making retrieval of relevant data stream files a long and arduous task. Further, correlating data between data stream files may be difficult, since a common key may not be available.

To facilitate discussion, FIG. 1 shows an overall logic view of how a host server interacts with plasma processing components (e.g., tools and subsystems) and sensors to collect different types of data. A host 102 may be receiving data from a plurality of tools, including tool 104, tool 106, and tool 108. Tools may include, but are not limited to, etch tools, clean tools, and strip tools. Each tool may have subsystems (110, 112, and 114). Subsystems may include, but are not limited to, electrostatic subsystems, RF subsystems, and pressure subsystems. Each tool and/or subsystems may include a plurality of sensors (120, 122, 124, 126, 128, 130, 132, 134, 136, 138, 140, 142, 144, 146, 148, 150, and 152). Some tools and/or subsystems may have more sensors than other. The sensors that may be available may depend upon the type of data that may be collected.

The data that are collected by the sensors are sent to host 102. The data that are collected are usually not correlated with one another. In an example, sensors 120 may be collecting RF time data while sensor 122 may be collecting pressure data during the etching of a substrate. However, the process data collected by sensors 120 and 122 may not have a key that may allow the data collected by sensor 120 to be correlated with the process data collected by sensor 122. Thus, even though an immense amount of data may be have been collected during the etching and/or cleaning of the substrate, the application of the process data toward troubleshooting a problem may be an arduous and complex task.

Troubleshooting a problem may depend upon the knowledge and skillset of the end-users (e.g., process engineers). In other words, the end-users first have to determine the problem and then identify the type of process data that may be relevant in resolving the problems. To further complicate the situation, not all relevant data may have been collected, despite the vast amount of data that may have been collected. Thus, the end-users may have the challenge of determining how to compensate for the missing data.

As a result, the complex task of troubleshooting a problem usually involves a lot of time and effort. For example, time is required to retrieve the necessary data stream files. Time is also required to mine the data stream files for the relevant data. Time is further required to determine the correlation between the data of the various data stream files. Thus, the process of troubleshooting may sometimes take weeks if not months to resolve. In some circumstances, the time required to troubleshoot a problem may exceed the time given to resolve the problem.

FIG. 2 shows a simple flow chart of what an end-user may have to perform in order to troubleshoot a problem. Consider the situation wherein, for example, a de-chuck problem may have occurred. At a first step 202, a de-chuck problem has been detected via an alignment data stream in the transfer module. In an example, a substrate is not sitting stable on the chuck and the robot arm of the transfer module may be unaligned. In the de-chuck situation, an experienced and skilled process engineer may realize that there may be four independent data stream files that may need to be retrieved in order to help with the troubleshooting. The four independent data stream files may include, for example, (1) dynamic alignment data from the transfer module, (2) electrostatic (ESC) process data from the process module, (3) event data from process module and/or user interface, and (4) process module consumable data.

As mentioned above, the data stream files may be located in various locations. Thus, the task of retrieving the data may require some time. In some circumstances, the retrieval process may take a few weeks if the data needs to be requested from other human administrator. At a next step 204, the end-user may have to search and locate ESC trace data for the problematic substrate in process module process data stream file. At a next step 206, the end-user may search and locate control event timing data via process module and/or user interface event data stream file. At a next step 208, the end-user may retrieve process module consumable data (RF times, wafer count, etc.) at the time of the problem. The end-user may then attempt to correlate the various consumable data. At a next step 210, the end-user may attach the process module and/or substrate recipe context information from event and trace data stream files.

Once all the data stream files have been retrieved, the end-user may begin the arduous task of correlating the data between the various data stream files. One common method of correlation is to compare the time the data has been collected. However, since process data may have been collected at different frequencies (e.g., sensor 120 may have collected data at every 1 second while sensor 122 may have collected data at every 500 milliseconds), the task of correlating the data based on time may be a daunting challenge. Consequently, troubleshooting a problem may become a long drawn-out process that may sometimes result in unsatisfactory conclusion.

SUMMARY OF INVENTION

The invention relates, in an embodiment, to a targeted data collection system configured to collect processing data in a plasma processing system. The targeted data collection system includes a data collection host. The targeted data collection system also includes a plurality of plasma processing components having a plurality of sensors such that each of the plurality of plasma processing components has at least one sensor of the plurality of sensors. Each of the sensors implements at least one intelligent targeted data agent that governs sensor data collection behavior. The targeted data collection system further includes a communication network coupling the data collection host and the plurality of sensors for bidirectional communication such that a given sensor of the plurality of sensors receives information from the data collection host pertaining to plasma processing system conditions occurring elsewhere from the given sensor. The information received from the data collection host causes the given sensor to collect at least a portion of the processing data a first manner different from a second manner employed by the given sensor prior to receiving the information from the data collection host.

In another embodiment, the invention relates to a method for collecting substrate processing data in a plasma processing system. The method includes providing a plurality of intelligent targeted data agent at a plurality of sensors such that each sensor of the plurality of sensors is controlled at least in part by at least one sensor of the plurality of sensors, wherein the plurality of sensors are disposed at different components of the plasma processing system. The method also includes collecting, using a given sensor of the plurality of sensors, first sensor data in a first manner. The method further includes thereafter receiving at the given sensor information from a data collection host, the information pertaining to at least plasma processing condition that occurred elsewhere from the given sensor. The method yet also includes thereafter changing, using a given intelligent targeted data agent associated with the given sensor. A sensor data collection behavior of the given sensor such that the given sensor collects second sensor data in a second manner is different from the first manner responsive to the receiving the information. The method moreover includes thereafter transmitting information pertaining to the second sensor data to the data collection host.

In yet another embodiment, the invention relates to an article of manufacture having thereon computer readable medium. The article of manufacture having thereon computer readable code that, when executed, governs data collection behavior of a sensor in a plasma processing system. The article of manufacture includes computer readable code for collecting first sensor data in a first manner. The article of manufacture also includes computer readable code for receiving information from a data collection host. The information pertains to at least one of a plasma processing condition that occurred elsewhere from the given sensor and a data collection command from the data collection host. The article of manufacture further includes computer readable code for collecting second sensor data in a second manner different from the first manner responsive to the receiving the information from the data collection host, wherein the second manner differs from the first manner in at least one of a frequency of data collection and a type of data collected.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
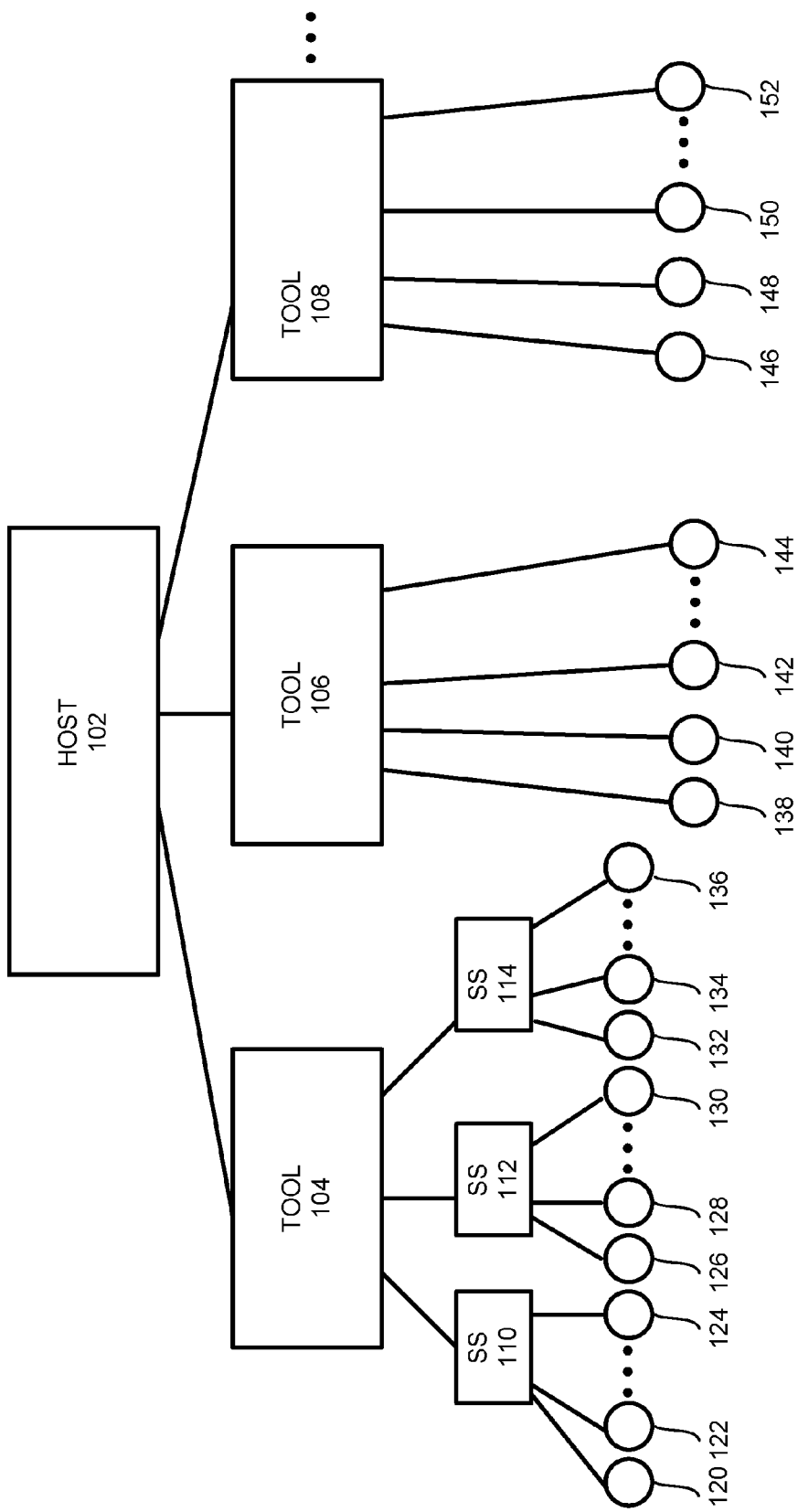
FIG. 1 shows an overall logic view of how a host server interacts with sensors, subsystems and tools to collect different types of data.
Figure 2:
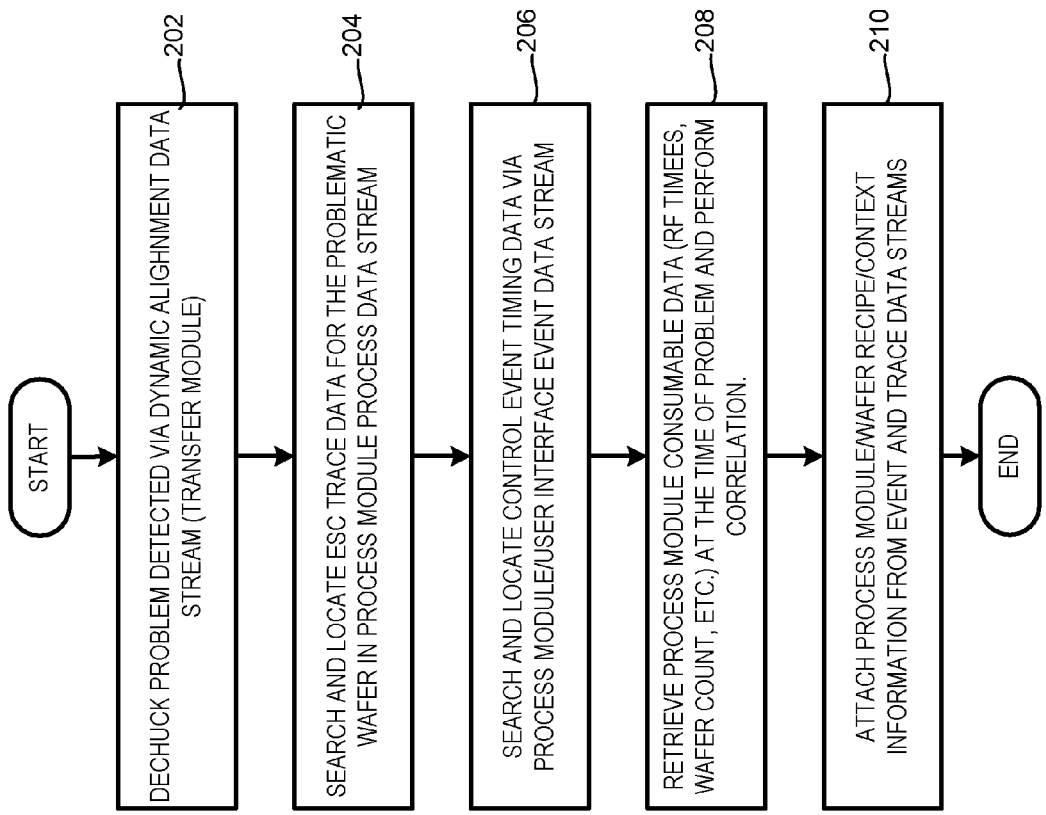
FIG. 2 shows a simple flow chart of what an end-user may have to perform in order to troubleshoot a problem.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, a targeted data collection architecture (TDCA) is provided in which data is communicated bi-directionally between the host, the different processing system components (e.g., tools and subsystems), and the sensors. As discussed herein, a processing system includes, but is not limited to, a plasma processing system and a cleaning processing system. Also, in embodiments of the invention, one or more intelligent targeted data agents may define the conditions for collecting relevant granular data. As discussed herein, intelligent targeted data agent refers to a computer-implemented method for collecting data.

In this document, various implementations may be discussed using plasma processing system. This invention, however, is no limited to a plasma processing system and may include cleaning system. Instead, the discussions are meant as examples and the invention is not limited by the examples presented.

In an embodiment of the invention, the targeted data collection architecture is a network system in which a host server is communicating with the various plasma processing components and the sensors. In an embodiment, the information being exchanged in the network is bidirectional. In an example, the host server may be continually receiving process data from the various sensors. Conversely, the sensors may be retrieving information from the host server, the plasma processing components, and other sensors.

Consider the situation wherein, for example, a plasma processing chamber is etching a batch of substrates. During the etching process, a plurality of data may be collected in the prior art. In an example, data about voltage bias is collected every second. If the processing takes one hour, 3600 data items have been collected for just the voltage bias. However, a plurality of other process data (e.g., pressure, temperature, etc.), besides the voltage bias, may also be collected. Thus, a considerable amount of data are being collected and stored by the time the etching process has completed.

Unlike the prior art, a vast amount of trivial data is not collected. Instead, the present invention focuses on collecting a large amount of data when specific conditions are met. To control the conditions under which sensors may collect and store data, intelligent targeted data agents are distributed throughout the network, in an embodiment. In an example, one or more intelligent targeted data agents may be distributed in the host server, the tools, the subsystems, and/or the sensors. The number of intelligent targeted data agents may vary. In an example, sensor1 may have 2 intelligent targeted data agents while sensor2 may have 5 intelligent targeted data agents.

Each intelligent targeted data agent may have one or more algorithms defining the condition(s) under which the intelligent targeted data agent may begin collecting data. In an embodiment, the conditions may be based on expert knowledge. In an example, a process engineer who is an expert on an etching process may be able to define acceptable standards for the etching process. With this knowledge, an intelligent targeted data agent may be programmed with an algorithm to collect and store x types of data at an x frequency when the acceptable standards are being violated.

To further explain, as an example, voltage bias data is being collected by a sensor every one second and discarded every 20 seconds. However, the sensor has an intelligent targeted data agent with an algorithm that defines the collection and storing of data to occur when the voltage bias is greater than 5 volts or lower than 3 volts. Thus, if the voltage bias ever goes above 5 volts or below 3 volts then the intelligent targeted data agent is triggered. The intelligent targeted data agent may include many criteria including but are not limited to, the type of data to collect, what other intelligent targeted data agent to trigger, and the frequency of the data collected.

In an embodiment, the method of collecting and storing data may be dynamically determined via a sliding window. Consider the situation wherein, for example, an intelligent targeted data agent at a sensor has been triggered. The intelligent targeted data agent may include an algorithm that provides instructions when the sensor should begin collecting the data, what types of data the sensor should be collecting, and the frequency at which each of the type of data should be collected. In addition, the algorithm may include instruction on how much data should be kept before and after the event. The sliding window method allows relevant data to be collected and stored.

Also, the sliding window method may allow more granular relevant data to be collected when conditions are met. In an example, data on voltage is collected every 10 microseconds. However, when a plasma processing component has a voltage of 350 or more, the frequency at which the data is collected may be increased to every 5 microseconds. Also, additional data, such as temperature, pressure, etc., may be collected. In an embodiment, the different types of data may be stored as a single file or may include a common key that may make correlation possible between multiple files. This method allow for relevant data to be collected and stored and the system to remove irrelevant data.

Figure 3:
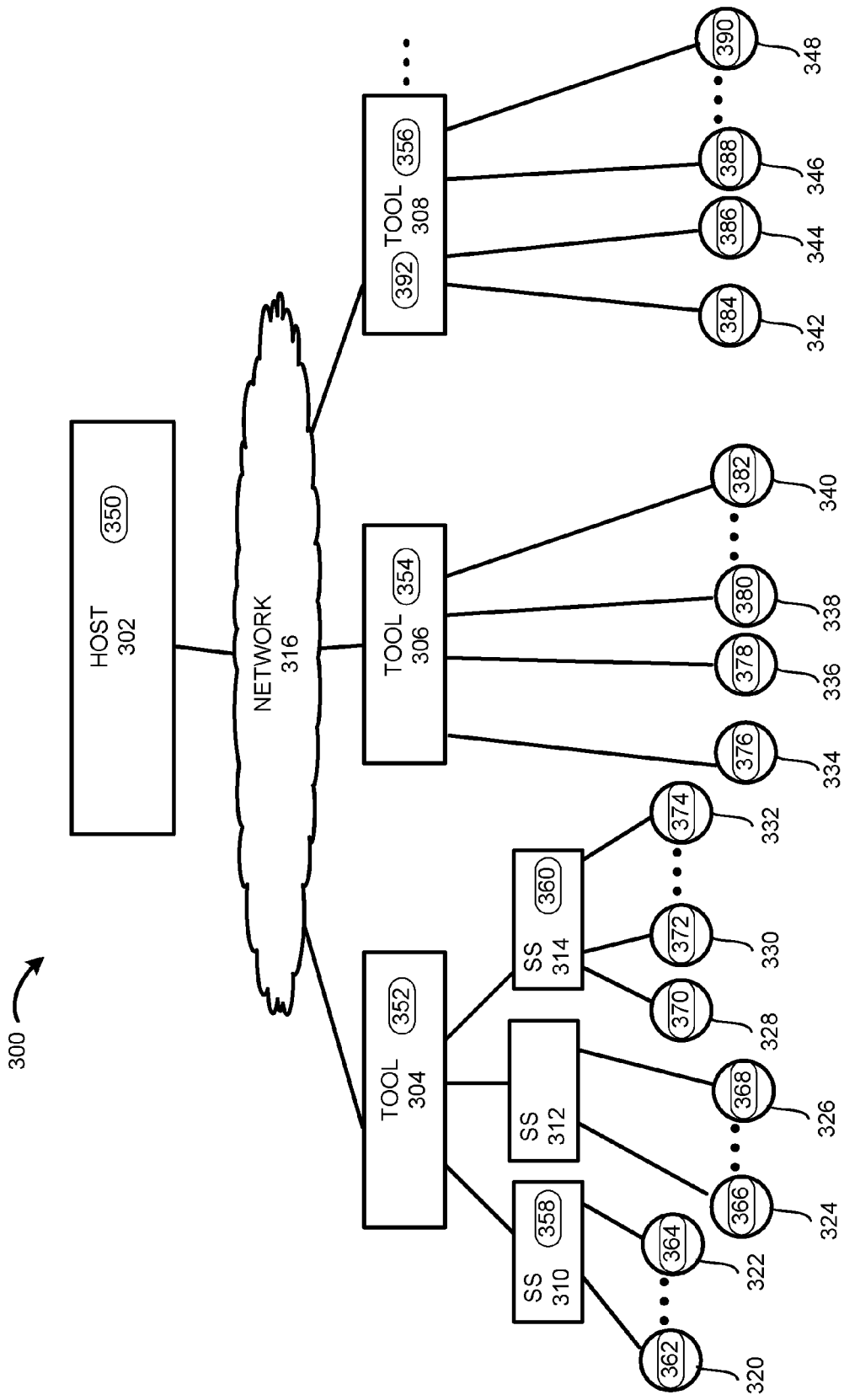
FIG. 3 shows in an embodiment, a logic diagram of an overall view of how a host server may interact with different plasma processing system components.

The invention may be better understood with reference to the figures and discussions that follow. FIG. 3 shows in an embodiment, a targeted data collection architecture. In other words, FIG. 3 shows an overall view of how a host server may communicate with different plasma processing system components (e.g., tools, subsystems, and sensors).

A targeted data architecture 300 may include a host 302 interacting with a plurality of tools, including tool 304, tool 306, and tool 308 via a network 316 (e.g., internet and/or intranet). Each tool may have a plurality of subsystems including, for example, ESC subsystem 310, RF subsystem 312, pressure subsystem 314, etc. Each tool and/or subsystem may have a plurality of sensors (320, 322, 324, 326, 328, 330, 332, 334, 336, 338, 340, 342, 344, 346, and 348). The number of sensors available may vary from tool to tool and from subsystem to subsystem. Some tools and/or subsystems may have more sensors than other. The sensors that may be available may depend upon the type of data that may be collected.

In an embodiment, the information being exchanged in the network is bidirectional. In an example, data may be collected and sent upstream to the related subsystem and tools via network 316 to ultimately reside at host 302. Each sensor may include the ability to collect measurement but may also include a processor to collect and handle the data that is being collected. In another example, sensors may be retrieving information from the host server, the plasma processing components, and other sensors. The retrieved information may govern the sensor data collection behavior. An example of such data includes recipe start, recipe end, server data collected elsewhere, statistical values pertaining to the process that has been calculated and provided to the sensors.

In an embodiment, intelligent targeted data agents (350, 352, 354, 356, 358, 360, 362, 364, 366, 368, 370, 372, 374, 376, 378, 380, 382, 384,386, 388, 390, and 392) may be distributed throughout the network, such as host 302, tool 304, tool 306, tool 308, ESC subsystem 310, pressure subsystem 314, and sensors (320-348). Although FIG. 3 shows mostly one intelligent targeted data agent per components, the number of intelligent targeted data agents may vary. In an example, RF subsystem 312 may have no intelligent targeted data agents. However, tool 308 may have two intelligent targeted data agents (356 and 392).

Figure 4:
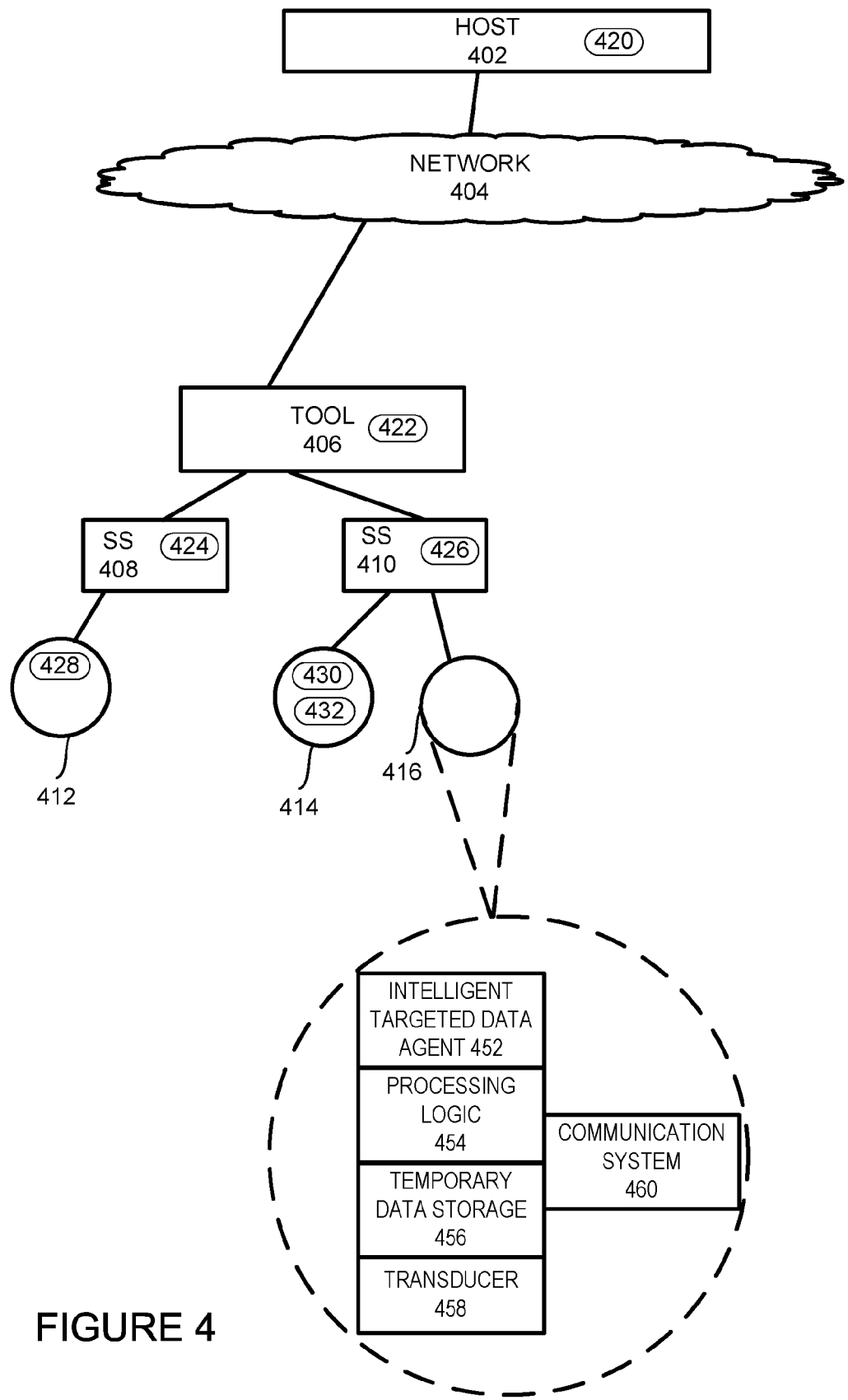
FIG. 4 shows, in an embodiment, a block diagram showing one example of how intelligent targeted data agents may be employed to gather and share data.

FIG. 4 shows, in an embodiment, a block diagram showing one example of how intelligent targeted data agents may be employed to gather and share data. A tool 406 may be connected to a host server 402 via a network 404. Tool 406 may include two subsystems (RF subsystem 408 and pressure subsystem 410). Each subsystem may have a plurality of sensors (412, 414, and 416). In addition, a plurality of intelligent targeted data agents (420, 422, 424, 426, 428, 430, 432, and 452) may be distributed throughout the network.

Consider the situation wherein, for example, sensor 416 may include one or more transducers 458. As discussed herein, a transducer refers to a device that measures conditions and/or signal data of a plasma processing component in one form and transforms the signal data into another form. Examples of transducers include, but are not limited to, thermocouples to measure temperature, voltmeters to measure voltage, pressure sensors to measure pressure, ampere meters to measure currents, etc.

Sensor 416 may also include intelligent targeted data agent 452. Intelligent targeted data agent 452 may include one or more algorithms defining the condition(s) under which data may be collected. In addition, intelligent targeted data agent 452 may also define, but are not limited to, the type of data to collect, what other intelligent targeted data agent to trigger, and the frequency of the data collected. In an example, intelligent targeted data agent 452 may include an algorithm that defines the condition in which intelligent targeted data agent 452 may be activated (e.g., when the voltage is 200 volts or more, begin collecting at every 10 microseconds).

In addition, sensor 416 may include processing logic 454 which enable sensor 416 to collect and handle the data that may be collected once conditions have been met. The data may be stored in a temporary data storage area 456 in sensor 416. Sensor 416 may also include a communication system 460 which may allow sensor 416 to communicate with host server 402 and other plasma processing components on network 404.

In an embodiment, intelligent targeted data agent 452 may include more than one algorithm. In an example, a second algorithm may require data to be collected every 9 microseconds when the temperature is 90 degrees centigrade or higher. In the situation where more than one algorithm is triggered, then the algorithm that requires the most granularity may be applied. In the example above, since both algorithms are met, than data is collected at the time frequency for the second algorithm (e.g., 9 microseconds) instead of the time frequency of the first algorithm (e.g., 10 microseconds).

An intelligent targeted data agent may not only affect the component on which the intelligent targeted data agent may be installed, but the intelligent targeted data agent may also affect the behavior of other components (e.g., sensors, subsystems) and/or tools. In an example, intelligent targeted data agent 432 of sensor 414 may not begin collecting signal data unless intelligent targeted data agent 430 sends a signal. However, intelligent targeted data agent 430 may remain inactive until the second algorithm of intelligent targeted data agent 452 of sensor 416 has been activated.

Figure 5:
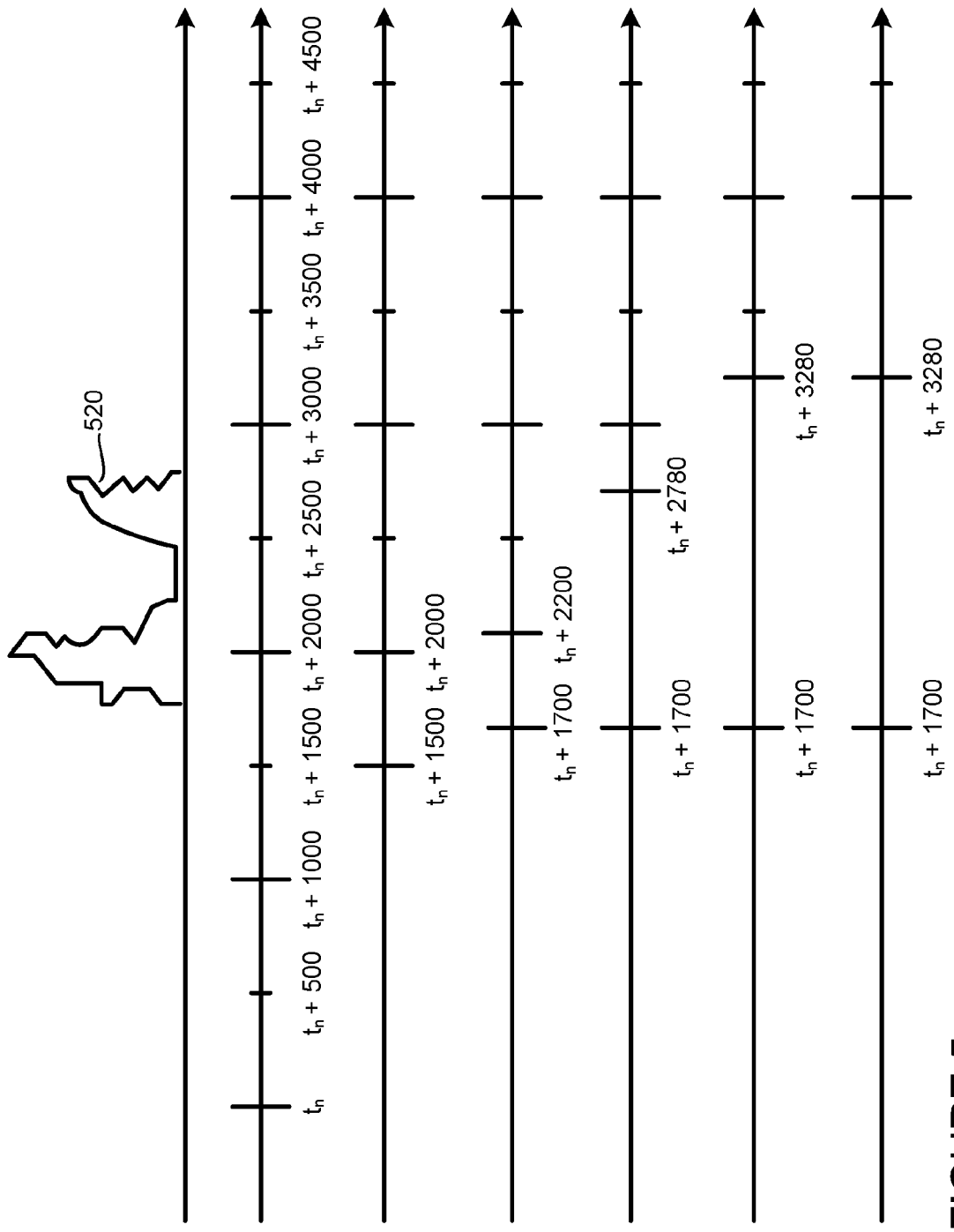
FIG. 5 shows in an embodiment, a method of dynamically determining when data need to be collected and stored via a sliding window.

FIG. 5 shows, in an embodiment, how intelligent targeted data agents may be employed to dynamically determine when data need to be collected and stored via a sliding window. The process engineers may define the condition under which data may be collected and stored for each intelligent targeted data agents. In an example, experts have indicated that when voltage bias data shows a two peak situation such as a plot 520 a condition has been met and data should be kept and stored. When the data is kept and stored, the data collected 500 milliseconds before and after the event should also be kept. In an example, at time n+2200 the data that is being produced indicates that the data may be the event. The data continues collecting until the event has ended (time n+2780). In addition, the data from 500 milliseconds before (n+1700) and after (time n+3280) the event may be collected. The data that has been collected prior to 500 milliseconds before the event (time n+1700) that was not relevant may be discarded.

The sliding window method allows the system to dynamically determine when a data stream file needs to be collected and stored. This method also allows for more granularity in the collection when the condition is met. In an example, prior to the condition being met, data has been collected at every 50 milliseconds. However, when the intelligent targeted data is triggered, data may now be collected at every 1 millisecond. Also, experts have identified that in addition to collecting voltage bias data when the condition is met, additional data (such as temperature, pressure, etc.) may also have to be collected. This method enables relevant data to be collected and stored, and the system to remove irrelevant data.

FIGS. 3-5 show that by employing intelligent targeted data agents, intelligence which traditionally has been kept at a host server may now be distributed throughout the network. By pushing the intelligence to the various plasma processing components, including the sensors, which measure and collect signal data, more relevant data may be collected. Instead of trying to collect a vast amount of data that may not be needed for performing troubleshooting at a later stage, conditions are defined under which relevant data may be collected and stored.

Figure 6:
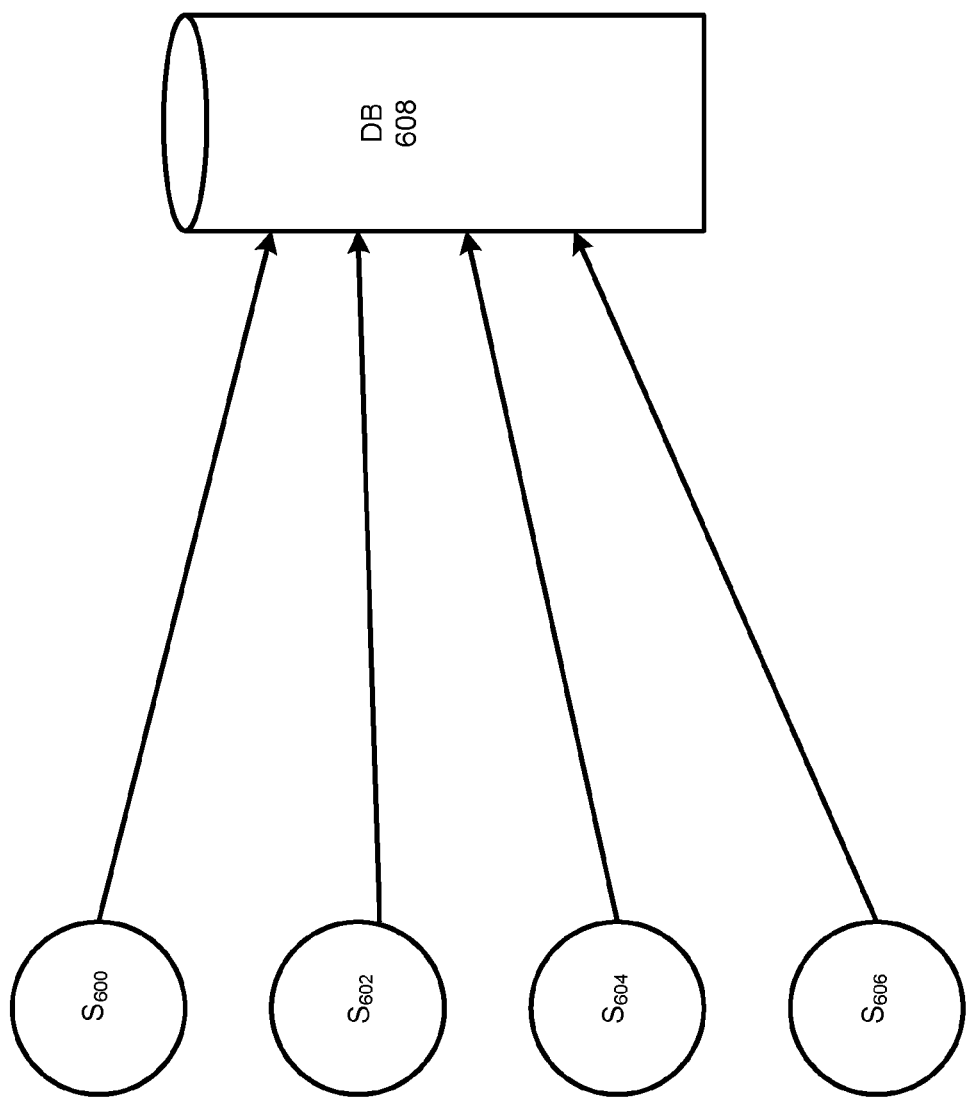
FIG. 6, shows in an embodiment, a method for storing data.

FIG. 6, shows in an embodiment, a method for storing data that may be collected when intelligent targeted data agents are not triggered. Consider the situation wherein, sensors 600, 602, 604, and 606 may be collecting data during the processing of a batch of substrates to be forwarded to a host server (i.e., database 608). During processing, a plurality of data may be collected. However, data that may be collected when an intelligent targeted data agent is triggered represents a small percentage of the data that may be collected. Since data collected during normal processing (e.g., when intelligent targeted data agent is not triggered) is generally not needed in performing troubleshooting, storing the data in its raw form may be counterproductive and make future analysis less efficient.

Instead, the raw data may be summarized and statistical calculations may be performed on the data for each duration set of time. In an example, sensor 600 may collect data every 500 milliseconds. After collecting the data, the system may summarize the data, perform statistical analysis, and discard the raw data every pre-defined set of time (e.g., one second). Statistical data may include a maximum, a minimum, an average, a mean, etc. By storing the raw data as statistical data, hi-level information about the processing of a substrate may still be maintained even though unnecessary detailed information about the processing may be removed.

As can be appreciated from the foregoing, embodiments of the invention enable the targeted data collection architecture to seamlessly transform ordinary sensors of plasma processing system into intelligent data gathering devices. With the present invention, the knowledge and skill of the human experts are incorporated into algorithms that may be stored in the plasma processing system as intelligent targeted data agents that define the conditions of collecting and storing process data; thus, relevant and/or granular process data of aberrations may be collected and stored. By capturing data that defines acceptable behaviors, the targeted data collection architecture increases the efficiency and effectiveness of the troubleshooting process while substantially leveling the skill required by the end-users.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention. Further, the abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A targeted data collection system configured to collect processing data in a plasma processing system, the target data collection system comprising:
    a data collection host;
    a plurality of plasma processing components associated with a plurality of sensors such that each of said plurality of plasma processing components is associated with at least one sensor of said plurality of sensors, each of said sensors including at least one agent that governs sensor data collection behavior, said plurality of sensors including at least a first sensor and a second sensor, said first sensor including at least a first agent, said first agent defining at least a first condition and a second condition, said first condition requiring said first sensor to collect a first set of data in a first manner if said first agent is active, said second condition requiring said first sensor to collect a second set of data in a second manner different from said first manner if said first agent is active, said second sensor including at least a second agent, said second agent defining at least a third condition, said third condition requiring said second sensor to collect a third set of data in a third manner if said second anent is active, said second agent remains inactive unless said first agent triggers said first sensor to collect said second set of data in said second manner; and a communication network coupling said data collection host and said plurality of sensors for bi-directional communication.

2. The targeted data collection system of claim 1 wherein said second manner differs from said first manner in frequency of data collection, said second sensor including at least a third agent that defines at least a fourth condition, said fourth condition requiring said second sensor to collect a fourth set of data in a fourth manner if said third agent is active, said third agent collects signal data it said second agent sends a signal.

3. The targeted data collection system of claim 1 wherein said second manner differs from said first manner in a type of data collected.

4. The targeted data collection system of claim 1 wherein said second manner employs a sliding window approach for data collection.

5. The targeted data collection system of claim 1 wherein said first sensor includes at least two different agents, said two different agents affecting data collection behavior of said first sensor.

6. The targeted data collection system of claim 1 wherein said first manner represents an inactive sensor state, said second manner representing an active sensor state.

7. The targeted data collection system of claim 6 wherein said first sensor enters said active sensor state from said inactive sensor state only after said first sensor receives information.

8. The targeted data collection system of claim 1 wherein said first sensor is configured to measure one of temperature, voltage, and current.

9. The targeted data collection s stem of claim 1 wherein said first sensor includes a processor configured to process a collected by said first sensor.

10. The targeted data collection system of claim 9 wherein said processor is configured to generate statistics from data collected by said first sensor.

11. The targeted, data collection system of claim 1 wherein said third set of data represents one of recipe start signal and recipe end signal.

12. A method for collecting substrate processing data in a plasma processing system, the method comprising:

providing a plurality of agents at a plurality of sensors such that each sensor of said plurality of sensors is controlled at least in part by at least one sensor of said plurality of sensors, wherein said plurality of sensors includes at least a fast sensor and a second sensor, and said plurality of sensors is disposed at different components of said plasma processing system;

implementing at least a first agent in said first sensor, said first agent defining at least a first condition and a second condition, said first condition requiring said first sensor to collect a first set of data in a first manner if said first agent is active, said second condition requiring said first sensor to collect a second set of data in a second manner different from said first manner if said first agent is active;

implementing at least a second agent in said second sensor to govern data collection behavior of said second sensor, said second agent defining at least a third condition, third condition requiring said second sensor to collect a third set of data in a third manner if said second agent is active; and keeping said second agent inactive unless said first agent triggers said first sensor to collect said second set of data in said second manner.

13. The method of claim 12 further comprising:

implementing at least a third agent in said second sensor said third agent defining at least a fourth condition, said fourth condition requiring said second sensor to collect a fourth set of data in a fourth manner if said third agent is active; and activating said third agent if said second agent sends a signal, wherein said second manner differs from said first manner in frequency of data collection.

14. The method of claim 12 wherein said second manner differs from said first manner in a type of data collected.

15. The method of claim 12 wherein, said second manner employs a sliding window approach for data collection.

16. The method of claim 12 further comprising implementing at least one additional agent in said first sensor for governing data collection behavior of said first sensor.

17. The method of claim 12 wherein said first manner represents an inactive sensor state, said second manner representing an active sensor state.

18. The method of claim 17 wherein said first sensor enters said active sensor state from said inactive sensor state only after said first sensor receives information.

19. The method of claim 12 wherein said first sensor is configured to measure one of temperature, voltage, and current.

20. The method of claim 12 wherein said first sensor includes a processor configured to process data collected by said first sensor.

21. The method of clam 20 wherein said processor is configured to generate statistics from data collected by said first sensor.

22. The method of claim 12 wherein said third set of data represents one of recipe start signal and recipe end signal.

23. An article of manufacture having thereon computer readable medium, said computer readable medium having thereon computer readable code that, when executed, governs data collection behavior of one or more sensors in a plasma processing system, the article of manufacture comprising:

computer readable code for a first sensor to collect a first set of data in a first manner if a first condition is met;

computer readable code for said first sensor to collect a second set of data in a second manner different from said first manner if a second condition is met;

computer readable code for implementing an agent for requiring a second sensor to collect a third set of data in a third manner if a third condition is met; and computer readable code for activating said anent if said first sensor collects said second set of data in said second manner.

24. The article of manufacture of claim 23 wherein said second manner employs a sliding window approach for data collection.

25. The article of manufacture of claim 23 wherein said first mariner represents an inactive sensor state said second manner representing an active sensor state.

26. The article of manufacture of claim 23 wherein said first sensor is configured to measure one of temperature, voltage, and current.

27. The article of manufacture of claim 23 further comprising computer readable code for processing data collected by said first sensor.

28. The article of manufacturer of claim 27 wherein said processing data includes generating statistics from said first set of data.

* * * * *